(12) United States Patent
Baumann et al.

(10) Patent No.: US 7,729,154 B2
(45) Date of Patent: Jun. 1, 2010

(54) INTEGRATED CIRCUIT WITH BURIED CONTROL LINE STRUCTURES

(75) Inventors: Dirk Baumann, Dresden (DE); Dominique Savignac, Ismaning (DE); Till Schloesser, Dresden (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 266 days.

(21) Appl. No.: 12/028,474

(22) Filed: Feb. 8, 2008

(65) Prior Publication Data

US 2008/0217655 A1 Sep. 11, 2008

(30) Foreign Application Priority Data

Feb. 10, 2007 (DE) .................. 10 2007 006 713

(51) Int. Cl.
*G11C 5/06* (2006.01)
(52) U.S. Cl. .......................................... 365/63; 365/72
(58) Field of Classification Search ................... 365/63, 365/72

See application file for complete search history.

(56) References Cited

U.S. PATENT DOCUMENTS

| 7,034,408 | B1 | 4/2006 | Schloesser | |
|---|---|---|---|---|
| 7,088,604 | B2 * | 8/2006 | Shirley et al. | 365/51 |
| 7,099,174 | B2 * | 8/2006 | Thompson et al. | 365/63 |
| 7,109,544 | B2 | 10/2006 | Schloesser et al. | |
| 7,149,112 | B2 * | 12/2006 | Kim | 365/185.05 |

FOREIGN PATENT DOCUMENTS

JP 2006294919 A 10/2006

* cited by examiner

*Primary Examiner*—Ly D Pham
(74) *Attorney, Agent, or Firm*—Dicke, Billig & Czaja, PLLC

(57) ABSTRACT

An integrated circuit with buried control line structures. In one embodiment, the control lines are subdivided into sections, wherein regions free of switching transistors are provided at intervals along the control lines. Connections for feeding the control potentials into the sections of the control lines are provided at least in a subset of the regions free of switching transistors. The isolations lines are connected to one another by an interconnect running transversely with respect to the control lines.

25 Claims, 14 Drawing Sheets

INTEGRATED CIRCUIT WITH BURIED CONTROL LINE STRUCTURES

CROSS-REFERENCE TO RELATED APPLICATIONS

This Utility Patent Application claims priority to German Patent Application No. DE 10 2007 006 713.7 filed on Feb. 10, 2007, which is incorporated herein by reference.

BACKGROUND

Memory components contain, as memory medium, a multiplicity of memory cells which form one or more blocks and can in each case store a binary datum (data bit), to be precise by assuming in each case one of two possible cell states, which are usually designated by the logic symbols "0" and "1". The memory cells in the state of the art are predominantly formed by electrical capacitances or capacitors and store the data by alternative distinguishable charge states, e.g., charged and uncharged. In each of the memory blocks, the memory cells are arranged in the manner of a matrix in rows and columns.

In conventional DRAM components, a plurality (e.g., $2^3$=8) of memory blocks each containing many rows (e.g., $2^8$=256 rows) and columns (e.g., $2^{12}$=4196 columns) are combined in row-parallel arrangement to form a bank, wherein the component contains a plurality (usually $2^2$=4) of such banks.

In order to write data bits to the cells or read them from the cells, each cell is assigned an individual cell switch via which the cell can be connected to a read/write line. These lines are referred to as bit lines. The cell switches, which are usually formed by field effect transistors and are referred to as selection transistors, can be driven selectively via word lines in order optionally to switch them on (that is to say make them conducting) or to keep them turned off. A respective common word line is provided for each matrix row of a memory block, and a respective common bit line is provided for each matrix column. If a word line is selectively activated, therefore, which is usually effected by a row decoder by the decoding of an externally applied row address, all the cell switches of the relevant row are closed.

This row selection is followed by the column selection, by one or more bit lines of the memory block being selectively connected to assigned data lines leading to an external data connection of the memory component. These connections are usually produced by selectively switching on read/write amplifiers on the bit lines by a column decoder that decodes an externally applied column address.

The word lines pass through the memory block in the row direction, also referred to hereinafter as the "x direction". The bit lines pass through the memory block in the column direction, also referred to hereinafter as the "y direction". These two directions are generally (but not necessarily) orthogonal to one another and each run in a plane parallel to the basic area of the semiconductor substrate. The direction pointing perpendicularly to these "horizontal" planes is referred to hereinafter as the "vertical" direction or "z direction". The expressions "top" (or "over" or "above") and "bottom" (or "under" or "below") relate to the spatial position along the z direction, the substrate being "bottommost".

In general it is desirable to make the horizontal packing density of the components of memory matrices on a chip as high as possible in order to accommodate as many components as possible on a given chip area. One way of increasing the horizontal packing density consists in arranging each memory cell and the assigned selection transistor vertically one above another rather than horizontally alongside one another. Since the channel zone and the drain and source zones of the selection transistors are formed by doping regions of the semiconductor substrate, it is recommended to integrate the memory cells in a level above the transistors.

In a known integration scheme, the selection transistors are shaped in such a way that their drain and source zones representing the "main connections" in each case form elevated regions on both sides of a groove in which is arranged the gate insulated from the bottom and walls of the groove. The gates of all the selection transistors for the respective same matrix row are formed by a common word line which extends in the x direction. The upper edges of the word lines lie below the upper edges of the grooves, and the space of the grooves that remains over the word lines is filled with insulating material, such that the word lines are "buried" in the grooves. The bit lines extending in the y direction are integrated in a level above the selection transistors, with interposition of an insulator layer. Each bit line is connected via vertical conductive feedthroughs to the first main connections of all those selection transistors which are respectively assigned to the same matrix column. The memory cells are integrated in a cell layer above the bit line level, likewise with interposition of an insulator layer. Each memory cell is contact-connected via a vertical conductive feedthrough to the second main electrode of the assigned selection transistor. In order to keep the horizontal extent of the memory cells as small as possible, the cells are shaped in such a way that large constituent parts of them extend in the vertical direction. Therefore, the cell layer is of necessity rather thick.

Since all the selection transistors are formed on the same semiconductor layer, particular measures are needed to decouple spatially adjacent transistors from one another. Particularly good decoupling or isolation is needed in each case between adjacent selection transistors assigned to different columns. For this purpose, it is known to integrate between the selection transistors in each case an "isolation transistor", which is formed in exactly the same way as the selection transistors and is kept constantly turned off by the application of a suitable gate potential. All isolation transistors oriented along the same row have as gate a common "isolation line", which is formed in a manner similar to the word lines and runs parallel thereto. All the isolation lines are permanently connected to a source of the reverse-biasing potential mentioned.

It is often desirable to segment a memory block in the row direction, particularly when the rows are very long. The longer a word line, the higher its RC time constant and the longer the duration of the row selection phase, that is to say the time until, after activation of the word line, all selection transistors connected thereto are fully turned on. In order to shorten this response time, it is known per se to subdivide the word lines into individual sections and to drive each section by a separate word line driver. These drivers are connected on the one hand to the assigned word line sections and on the other hand to interconnects which extend in an upper metallization level above the cell layer in the row direction, to be precise over the entire row length.

The segmentation of the word lines of a memory block is difficult if the word lines are buried in the manner described above and in addition buried isolation lines are present. The word line drivers require a relatively large amount of integration area, and all those parts of the drivers which are not contact-connected to the assigned word line must remain decoupled both from the word line and from an adjacent isolation line. It is not known or suggested how this could be achieved without increasing the "pitch" of the word and isolation lines (that is to say the spatial period of the lines in the y direction). Moreover, the question remains open as to via which paths the isolation lines in all their parts should be connected to the permanent reverse-biasing potential.

For these and other reasons, there is a need for the present invention.

SUMMARY

One embodiment provides an integrated circuit including switching transistors, isolation transistors arranged between the switching transistors, control lines for applying control potentials to the switching transistors, the control lines being buried structures, and isolation lines arranged between control lines for applying a potential to the isolation transistors to keep the isolation transistors turned off, the isolation lines being buried structures. The control lines are subdivided into sections, wherein regions free of switching transistors are provided at intervals along the control lines. Connections for feeding the control potentials into the sections of the control lines are provided at least in a subset of the regions free of switching transistors. The isolations lines are connected to one another by an interconnect running transversely with respect to the control lines.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
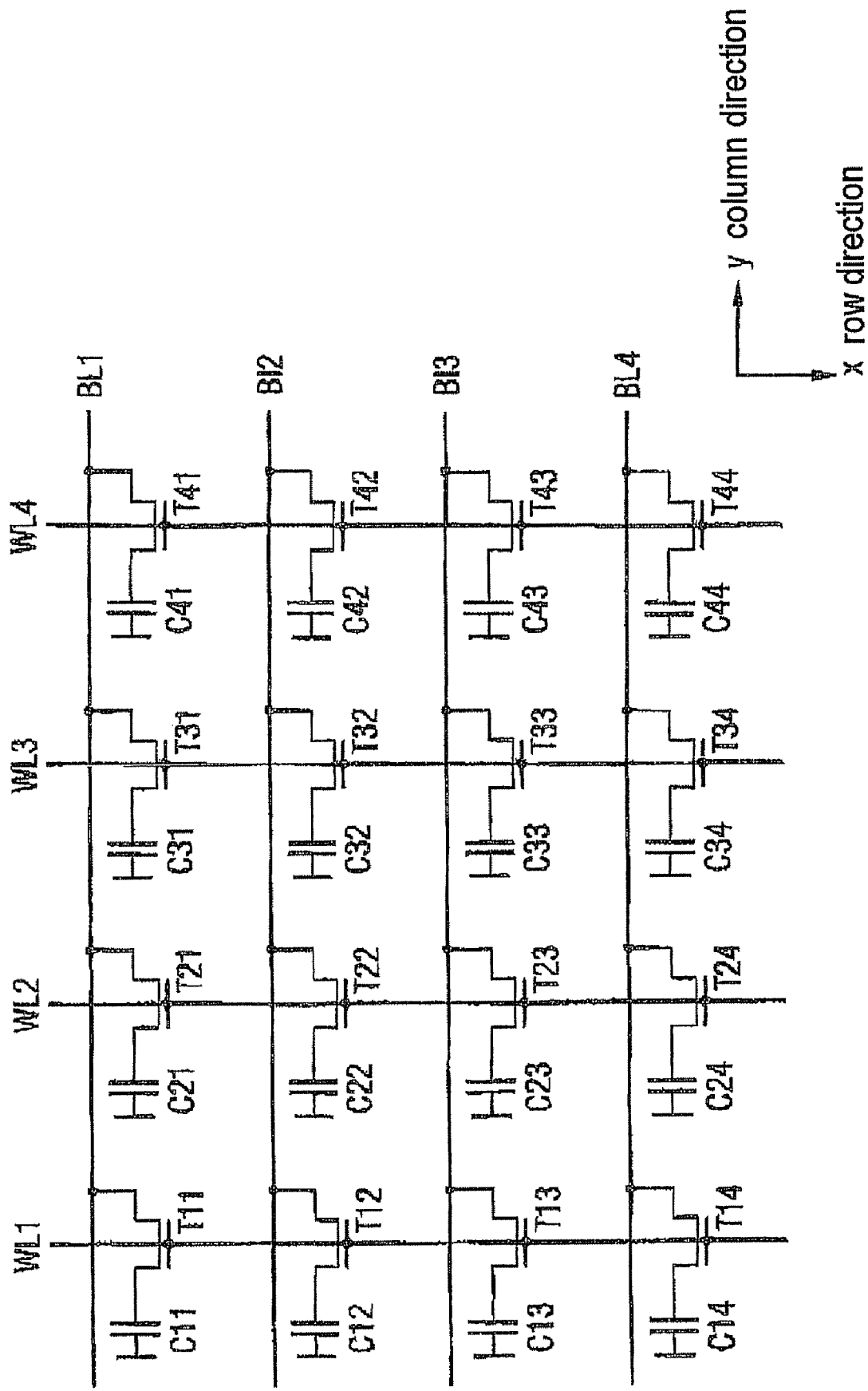
FIG. 1 illustrates the fundamental circuit diagram of an excerpt from a memory matrix with 4 times 4 memory cells, the assigned 16 selection transistors, four word lines and four bit lines.

FIG. 1 illustrates the circuit diagram of an excerpt from a memory block containing a multiplicity of memory cells which are arranged in the manner of a matrix in rows and columns. The excerpt illustrated includes sixteen memory cells forming four rows and four columns. Each row is assigned a word line which extends in the row direction "x" and is designated by WL, followed by a numeral indicating the ordinal number i of the relevant row within the memory block. Each column is assigned a bit line which extends in the column direction "y" and is designated by BL, followed by a numeral indicating the ordinal number j of the relevant column. The memory cells, formed as capacitors, are designated by the letter C, followed by two numerals, the first of which indicates the ordinal number i of the row and the second of which indicates the ordinal number j of the column. This scheme of designations and numberings also applies equally to other Figures and the whole of the description below.

In accordance with FIG. 1, one side of each storage capacitor Cij is connected to one main connection (source or drain, depending on current flow direction) of an individually assigned field effect transistor Tij, the selection transistor. The other side of the capacitor is connected to a source of a reference potential, which is symbolized by a short bold bar line in the drawing and is common to all the storage capacitors. The other main connection (drain or source) of each transistor Tij is connected to the bit line BLj assigned to the relevant matrix column. The gate of each transistor Tij is formed by the word line WLi assigned to the relevant matrix row.

In the case of the present invention, a structure known as "buried word lines" is used for the word lines WL and the transistors T. There are various variants of such a structure which share the feature that the word lines are sunk in depressions of active regions of a semiconductor layer which contain selectively doped regions for forming the transistors. The transistors can be formed as vertical transistors, wherein the sequence of dopings which forms the path from the source zone via the channel zone to the drain zone is vertical and the word line runs mid-way between source and drain zones. In another variant, the transistors are only partly vertically structured, wherein the source and drain zones are arranged horizontally alongside one another and the channel zone is formed at the walls of an intervening depression or groove. Such a transistor structure, which can clearly be referred to as "deeply drawn horizontal transistor", is illustrated in FIG. 2A.

Figure 2A:
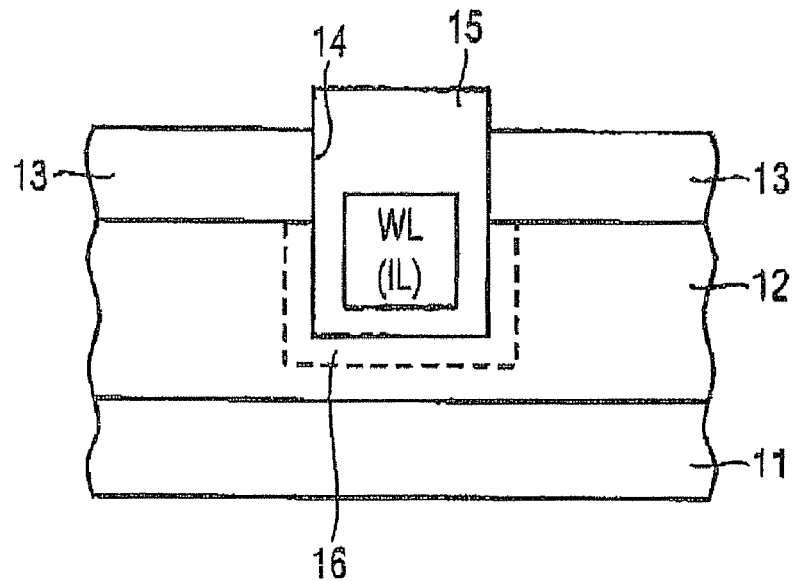
FIGS. 2A and 2B illustrate the physical structure of a selection transistor formed as a field effect transistor with a buried word line as gate.

FIG. 2A illustrates a field effect transistor that is deeply drawn in the manner mentioned above and the word line WL embedded therein in a vertical section in the y direction (that is to say transversely with respect to the word line). Situated over a substrate layer 11, e.g., composed of undoped semiconductor material (e.g., silicon), is a semiconductor layer 12 having $p^-$-type doping and over that a semiconductor layer 13 having $n^+$-type doping, which forms the source and drain zones. The word line WL runs in a manner sunk in a vertical groove 14, which extends in the x direction and reaches through the $p^+$-type layer 13 down deeply into the $p^-$-type layer 12, the word line being insulated from the bottom and walls of the groove 14 by an insulating material 15 such as e.g., $SiO_2$. The insulating material 15 also fills the interior of the groove 14 over the word line WL and, in one embodiment, reaches beyond the surface of the topmost layer 13. The word line WL is composed of a conductive material (e.g., metal or a metal compound such as, for example, titanium nitride TiN) and acts as a gate in order, upon driving with a suitable activation potential (positive relative to the layer 13), to form an n-conducting channel 16 in the $p^+$-type layer 12 between the mutually opposite zones of the drain/source layer 13. An N-channel field effect transistor (NFET) is formed in the manner described. As an alternative, P-channel field effect transistors can also be formed equally well, in which case the stated polarities of the doping and of the activation potential should be reversed.

One advantage of the transistor illustrated in FIG. 2A is that its horizontal extent transversely with respect to the word line can be kept small and the length of the channel 16 from the source zone to the drain zone is nevertheless relatively long. The longer this channel length, the better the blocking properties of the transistor, which is important precisely for the selection transistors in memory matrices. One further advantage is that the main connections (drain and source) of the transistor lie in the same horizontal plane, such that the contact paths from the connections to the assigned memory cell C and to the assigned bit line BL can be integrated more simply and also in a manner that saves space better than in the case of vertical transistors.

Figure 2B:
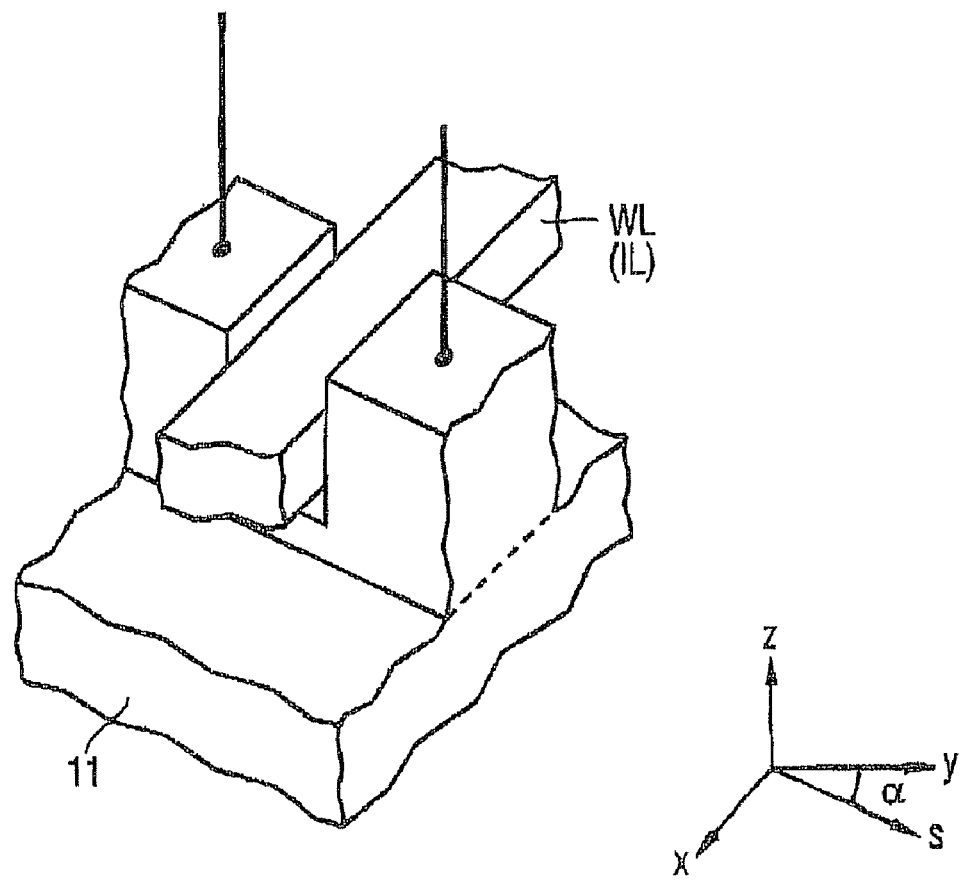

FIG. 2B illustrates the transistor as a sectional view in FIG. 2A with the portion of a word line WL buried therein in a perspective view. This Figure does not illustrate the insulating material in order to improve the clarity of the illustration. The contact paths at the main connections of the transistor for connecting a memory cell C and a bit line BL are additionally indicated by simple vertical lines in FIG. 2B.

The definitions given further above are applicable with regard to the relative orientation of the directions "x" and "y" and the direction "z" perpendicular thereto. In the perspective chosen for FIG. 2B, the lines proceeding in the y direction run horizontally in the plane of the drawing, the lines proceeding in the z direction run vertically within the plane of the drawing, and the lines proceeding in the x direction run within the plane of the drawing in a manner falling toward the left obliquely at an angle of 45°. This is illustrated by the small arrow diagram in FIG. 2B and also applies equally to the subsequent Figures.

Figure 3:
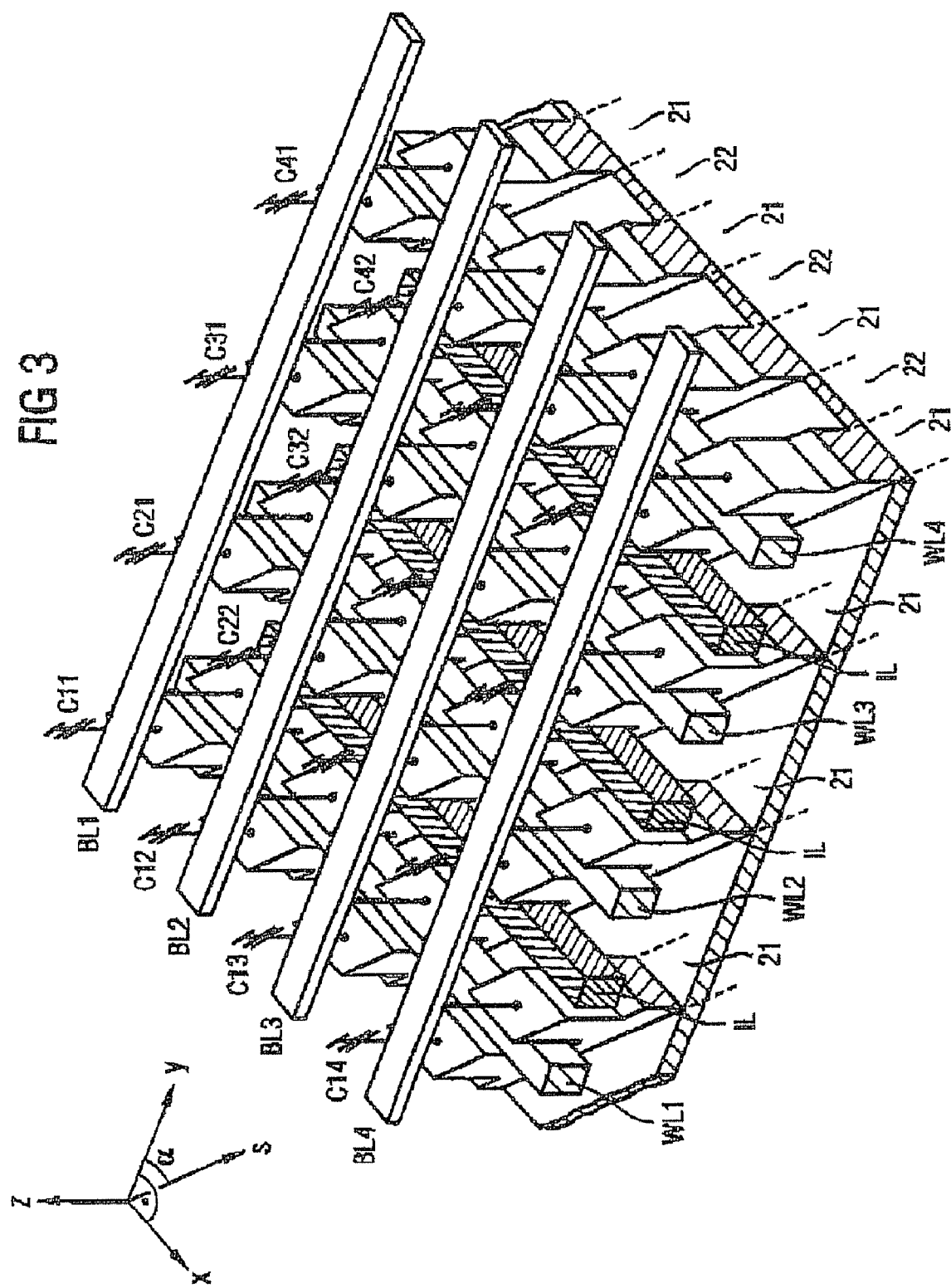
FIG. 3 perspectively illustrates the physical structure of an excerpt from a first variant of a memory matrix with isolation transistors and buried isolation lines between adjacent matrix rows.

FIG. 3 illustrates in a perspective illustration an example of how the components of the memory matrix illustrated in FIG. 1 can be spatially arranged in a manner if a structure as illustrated in FIGS. 2A and 2B is used for the selection transistors T. As can be discerned in FIG. 3, the transistors are formed along strip-type "active" semiconductor regions 21 on the substrate 11, wherein the active regions contain the doped layers 12, 13 illustrated in FIG. 2A with the grooves 14. The bit lines BL are integrated in a level above the transistor strips 21, and the memory cells C are integrated in a "cell layer" in a level above the bit line level. The space between the levels is filled with insulating material. In order to keep the illustration clear, the insulating material is not illustrated in FIG. 3 and the memory cells C are only illustrated schematically by capacitor circuit symbols. The vertical contact paths between the main connections of the transistors and the assigned bit lines BL and memory cells C, that is to say the conductive feedthroughs through the insulating material, are symbolized in a simplified manner by thick vertical lines.

In accordance with FIG. 3, the active strips 21 do not run in the y direction parallel to the bit lines BL, but rather in a direction "s" running at an angle $\alpha$ obliquely with respect to the x direction, as illustrated by the small arrow diagram in FIG. 3. This facilitates the integration of the vertical contact paths leading from the transistors to the memory cells C in the space between the bit lines BL. The active strips 21 are electrically isolated from one another by deep trenches 22 which reach as far as the substrate 11 and are filled with insulating material. This isolation serves for decoupling the selection transistors that are adjacent in the row direction (x direction). Between the adjacent selection transistors within the respective same strip 21, however, there is a need for better decoupling if they are assigned to different bit lines BL. For this reason, it is known to implement the decoupling within the strips by using interposed field effect channels which are kept permanently in the off state by using a suitable gate potential. These "isolation channels" are shaped in exactly the same way as the channels of the selection transistors. They are formed by grooves in the active strip and "isolation lines" IL buried therein as gate. The isolation lines IL are formed like the word lines WL and run parallel thereto in the x direction. They are shown as shaded in FIG. 3.

FIG. 3 illustrates one embodiment in which an isolation channel with an embedded isolation line IL is situated between all adjacent selection transistors of the respective same strip 21. That also means that a respective isolation line IL is provided between all adjacent word lines WL. If a memory block includes a total of n rows and hence n word lines, then this embodiment must include n−1 isolation lines, that is to say a total of 2n−1 parallel lines and n transistor channels in series next to one another along the strips 21.

Figure 4:
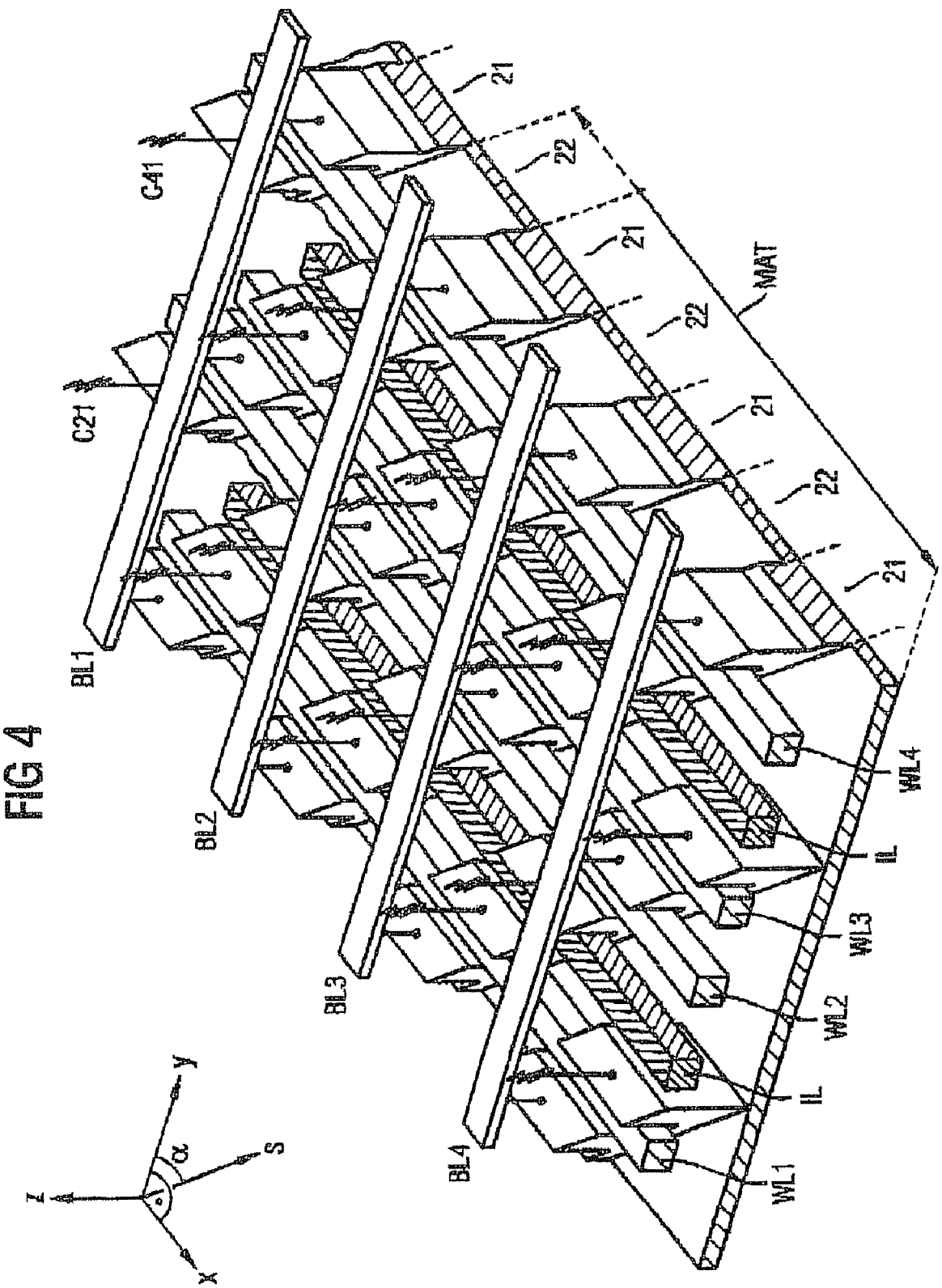
FIG. 4 perspectively illustrates the physical structure of an excerpt from a second variant of a memory matrix with isolation transistors and buried isolation lines between adjacent pairs of matrix rows.

FIG. 4 illustrates, in a similar perspective illustration to FIG. 3, one embodiment in which in each case two adjacent selection transistors in the same strip 21 share a common main connection, to be precise the bit line connection. Accordingly, the two transistors of each such pair are connected in mirror-inverted fashion with respect to one another, wherein the main connections for the memory cells C lie in a manner facing away from one another. An isolation channel only needs to be provided between adjacent transistor pairs, and accordingly an isolation line IL only needs to be provided between adjacent word line pairs. This reduces the number of isolation lines in an n-row memory block to n/2−1.

FIG. 4 illustrates, at the front end, the formation of an edge 25 running in the y direction, where a region MAT ends, which region is filled by a matrix of memory cells, bit lines and word lines.

Figure 5:
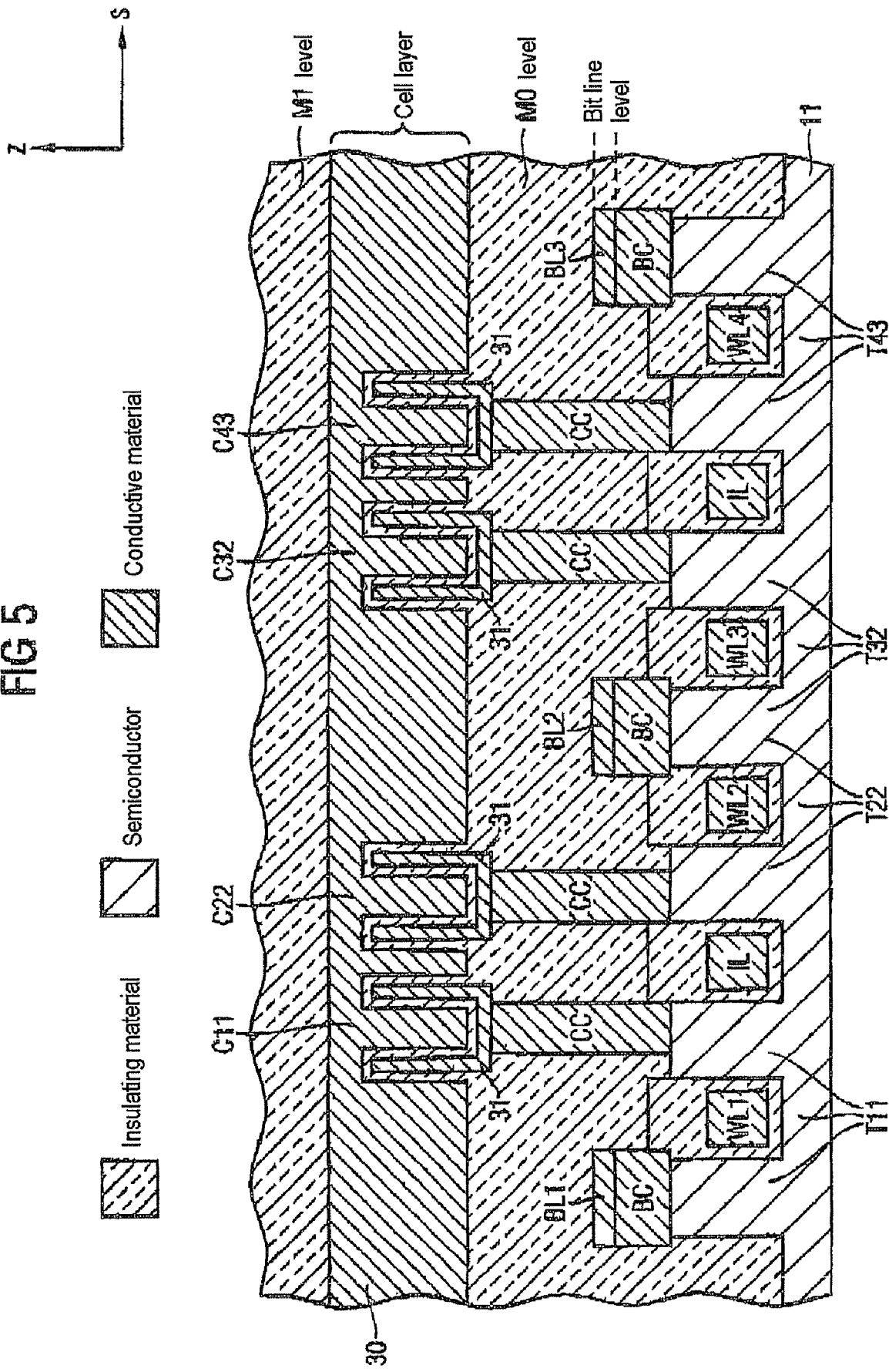
FIG. 5 illustrates the view of a vertical section through the structure according to FIG. 4 along a strip of selection and isolation transistors.

FIG. 5 illustrates the view of a vertical section in the s direction along the center line of one of the active strips 21, to be precise specifically of that strip which is designated by 21\* in FIG. 4. This section covers all the word lines WL1 to WL4 and all the isolation lines IL, and also the selection transistors T11, T22, T32 and T43 for the memory cells C11 (first row, first column), C22 (second row, second column), C32 (third row, second column) and C43 (fourth row, third column). The bit lines BL1, BL2 and BL3 are sectioned obliquely. The sectional view furthermore reveals the vertical contact paths BC between the selection transistors and the bit lines BL (bit line contacts) and the vertical contact paths CC between the selection transistors and the memory cells C (cell contacts).

The memory cells C are formed as capacitors in such a way that they extend predominantly in the z direction in order simultaneously to obtain a high capacitance value and a high horizontal packing density. Those sides of the capacitors C which are remote from the selection transistors T and are connected to the common reference potential REF are formed by a common conductive plate 30. The other side of each capacitor C is a tubular structure 31 composed of conductive material, one end of which makes contact with the assigned cell contact CC and the other end of which reaches into a matching annular groove in the plate 30. An interspace between the tubular structure 31 and the walls of the annular groove is filled with an insulating material that forms the dielectric of the capacitor. The dimensions of this capacitor structure are not shown to scale. In practice, the capacitor tubes 31 are significantly longer in the z direction than illustrated, such that the plate 30 and hence the overall cell layer has a considerable thickness.

The present embodiment illustrates how the buried word lines WL can be segmented and the word lines and the isolation lines IL can in this case be connected to their respectively assigned potential sources.

Figure 6:
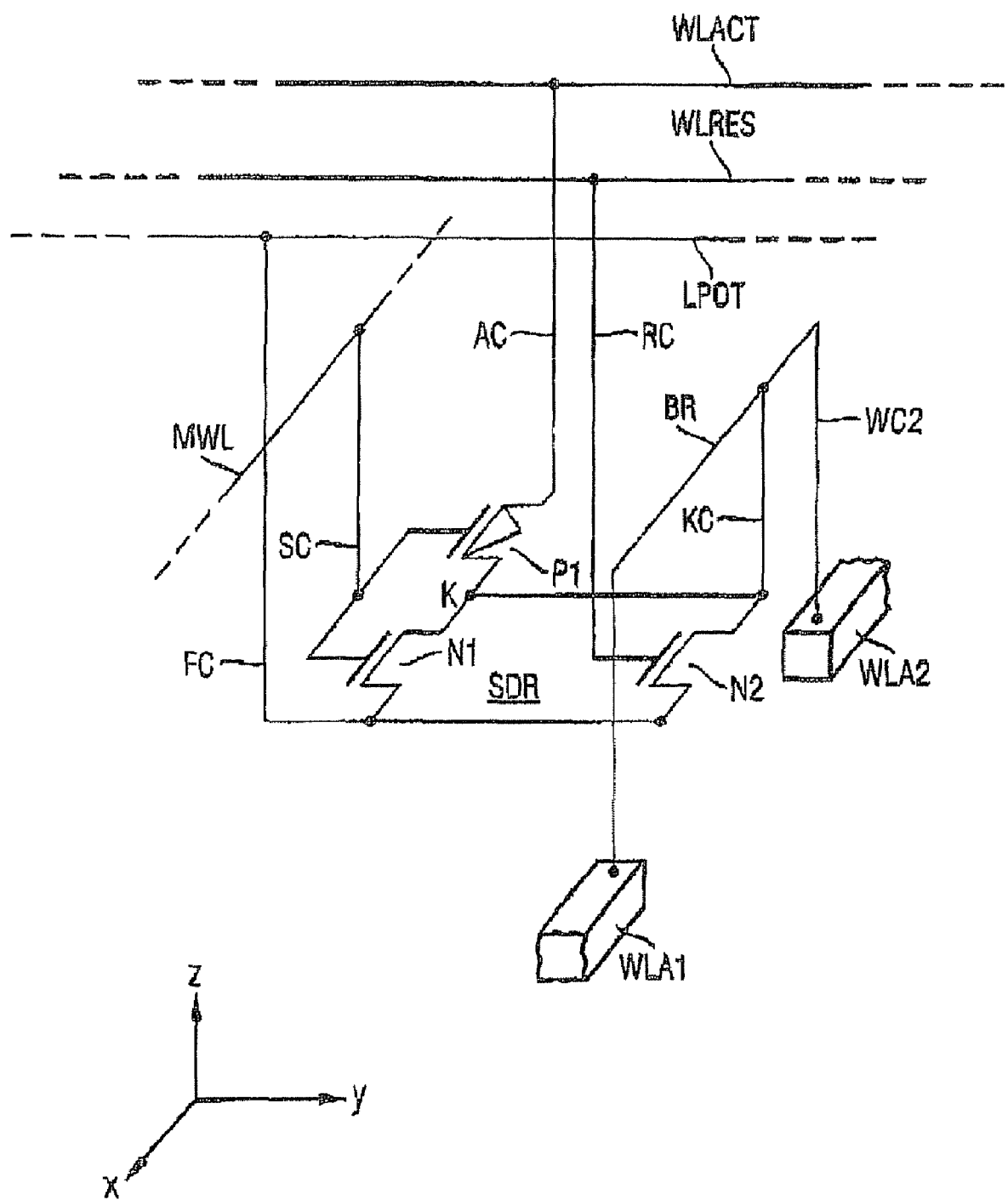
FIG. 6 illustrates the circuit diagram of a driver for word line segments.

Firstly, a description shall be given of the case where individual drivers are provided for the individual word line segments of each matrix row of the memory block in order to change over the electrical potential of the relevant segments between an activation potential (H potential), which turns on the selection transistors of the relevant row, and a deactivation potential (L potential), which turns off the selection transistors of the relevant row. The circuit diagram of an exemplary embodiment of such a "segment driver" SDR is illustrated in FIG. 6. The illustration is perspective in order to roughly illustrate the directions of the spatial extension of the driver components and the connection contacts. The small arrow diagram in FIG. 6 illustrates the assignment of the orientation of the lines of the circuit diagram to the three spatial directions x (row direction), y (column direction) and z (vertical direction) defined above.

The driver SDR, which is formed from one PFET P1 and two NFETs N1 and N2, occupies an integration area in the xy plane, and its connection contacts extend in the z direction. A circuit node K is connected to an "activation contact" AC via the channel of P1 and to a "foot contact" FC via the channel of N1. The gates of P1 and N1 are connected to a "selection contact" SC. The arrangement of the transistors P1 and N1 forms an amplifier with the circuit node K as amplifier output. The output is connected via an output contact KC to a bridge line BR, which, for its part, is connected via two "word line contacts" WC1 and WC2 to the ends of two adjacent word line sections WLA1 and WLA2 belonging to the same matrix row. The amplifier output K is additionally connected to the foot contact FC via the channel of N2. The gate of N2 is connected to a "reset contact" RC.

During operation, the foot contact FC is held at a supply potential, which corresponds to the deactivation potential ("low" L potential) for the word lines and is negative with respect to the activation potential ("high" H potential) in the example illustrated. For activating the word line sections WLA1 and WLA2, the activation contact AC is put at H potential, the reset contact RC is put at L potential, and the selection contact SC is put at L potential. As a result, the amplifier output K and hence the word line sections WLA1 and WLA2 go to H potential. For deactivating the word line sections, the activation contact AC is put at L potential, the reset contact RC is put at H potential, and the selection contact SC is put at L potential. As a result, the amplifier output K and hence the word line sections WLA1 and WLA2 go to L potential.

The selection contacts SC of all the segment drivers SDR which are respectively assigned to the same row are connected to an interconnect MWL (master word line) which is individually assigned to the relevant row, extends in the row direction over the entire memory block and is integrated in a metallization level above the integration level of the segment drivers. The activation and reset contacts AC and RC are connected to interconnects WLACT and WLRES, respectively, which are respectively assigned to a group of a plurality of rows (e.g., four rows). Consequently, a row group is preselected via these lines, while an individual row within the row group is selected via the master word line MWL. The master word lines MWL are connected to master drivers at a longitudinal end of the memory block (that is to say at the end of the rows), the master drivers, for their part, being selected by an assigned row decoder stage depending on a few bits of a row address.

The interconnects WLACT and WLRES and the interconnect LPOT are likewise integrated in one or more metallization levels above the integration level of the segment drivers SDR. The interconnects WLACT and WLRES are likewise connected to master drivers, which, for their part, are selected by an assigned row decoder stage depending on other bits of the row address. FIG. 6 illustrates the exemplary case where the interconnects WLACT, WLRES and LPOT run within the memory block in the y direction, that is to say in the column direction transversely with respect to the rows. In this case, the interconnects emerge from the memory block at one or both lateral edges and run there in a bundle parallel to the lateral edges to the longitudinal end of the memory block. As an alternative, one or two or all of the interconnects WLACT, WLRES and LPOT can run within the memory block in the row direction.

Figure 7:
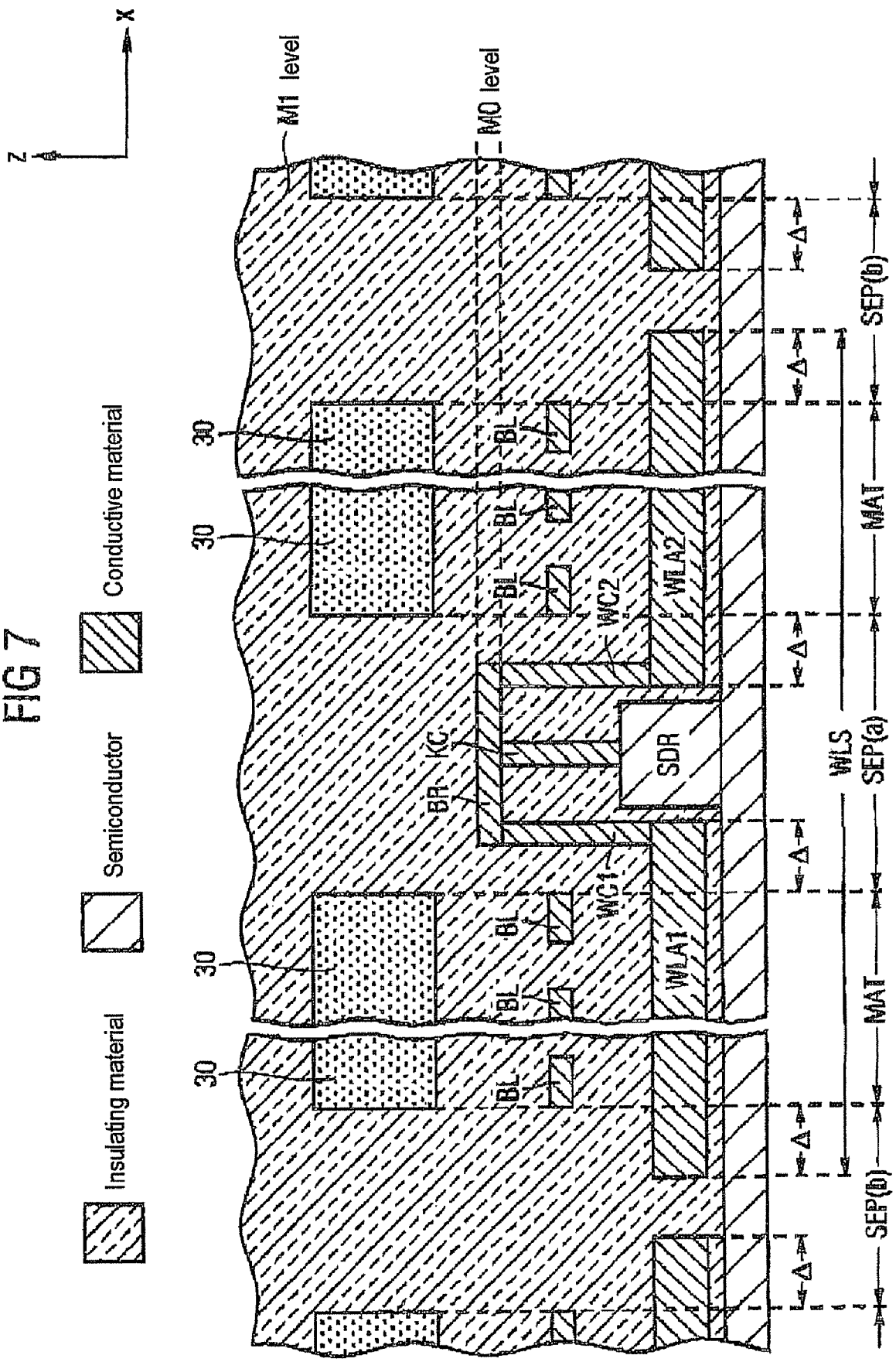
FIG. 7 illustrates in fragmentary fashion a vertical section—taken along a buried word line—through a memory block with segment drivers.

FIG. 7 illustrates the fragmented view of a section through a memory block in a vertical plane running along the word line sections WLA1 and WLA2 according to FIG. 6, that is to say in an xz plane. In accordance with this illustration, the length of the memory block is subdivided into a plurality of sections which periodically succeed one another:

Sections which are designated here as "matrix regions" MAT in each case include the structure illustrated in FIGS. 4 and 5 with the buried word and isolation lines WL and IL, the active transistor strips 21, the bit lines BL and the memory cells C, the latter being accommodated in the cell layer 30 lying over the bit lines BL. Situated between the matrix regions MAT are sections which are designated here as "separating regions" SEP. In the embodiment according to FIG. 7, the word lines WL are interrupted in all the separating regions SEP and form separate word line sections WLA which reach into all the separating regions SEP on both sides in each case by a portion Δ.

The illustration in FIG. 7 extends over a length encompassing three separating regions SEP. The segment drivers SDR are integrated in the middle separating region SEP(a), which segment drivers can in each case be implemented by the circuit illustrated in FIG. 6. The driver circuit SDR itself is illustrated in a simplified manner as a block in FIG. 7. The illustration furthermore illustrates the vertical output contact KC, the bridge line BR situated over the latter, the bridge line extending on both sides in the x direction to beyond the boundary of the driver circuit SDR, and the two word line contacts WC1 and WC2, which lead on both sides of the driver SDR from the bridge line BR downward to the two adjacent word line sections WLA1 and WLA2. The other contacts FC, SC, AC and RC of the driver circuit SDR illustrated in FIG. 6 are not illustrated in FIG. 7.

Two word line sections WLA1 and WLA2 controlled by the same segment driver SDR respectively form together with the bridge line BR a "word line segment" WLS, which ends at the next separating regions SEP(b). No segment driver is situated in the separating regions SEP(b). Driver-occupied separating regions SEP(a) and driverless separating regions SEP(b) alternately succeed one another in the x direction.

Figure 8:
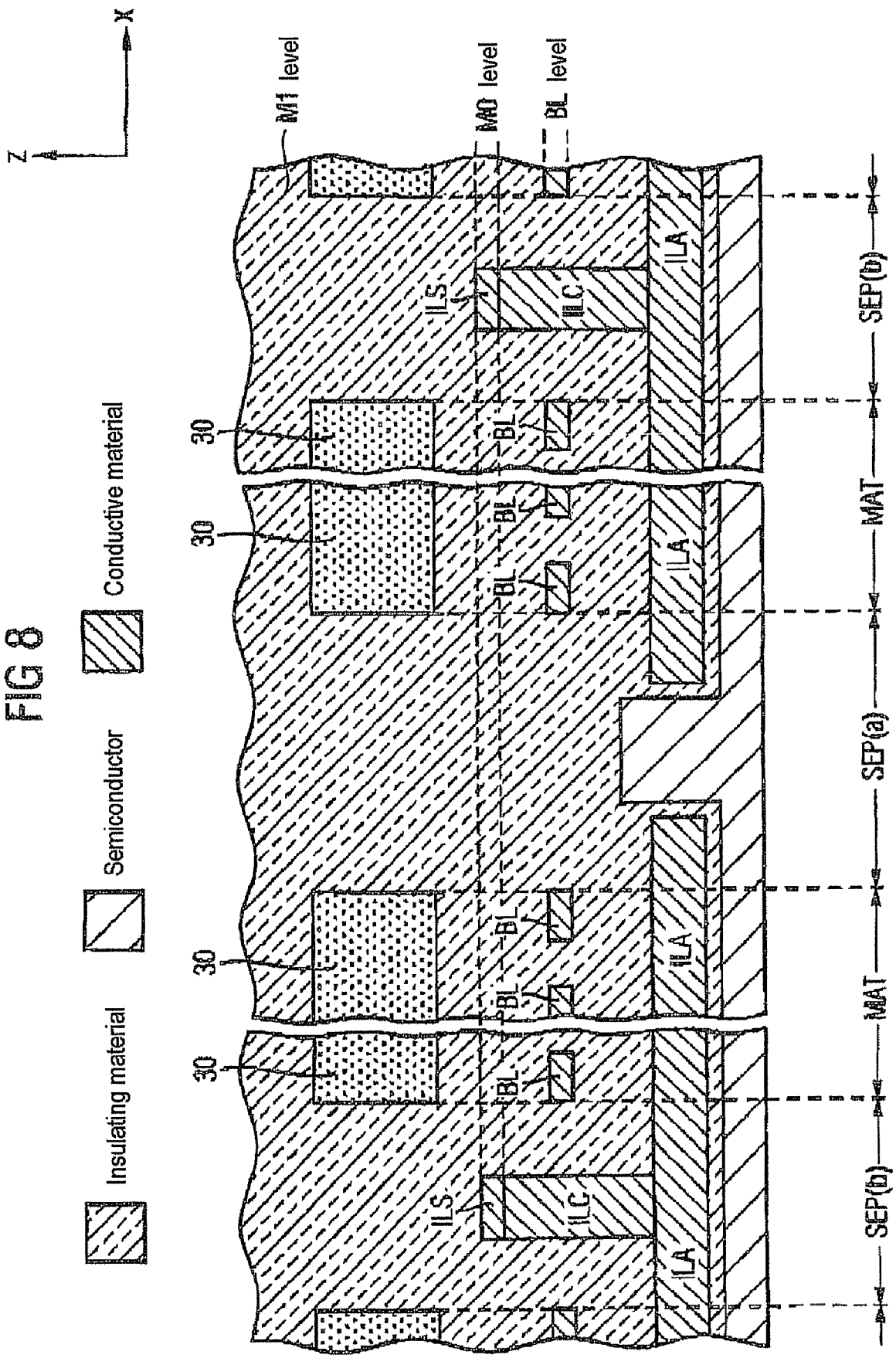
FIG. 8 illustrates in fragmentary fashion a vertical section—taken along a buried isolation line—through the memory block according to FIG. 7.

FIG. 8 is the fragmented view of a section through the memory block illustrated in FIG. 7 in an xz plane at the location of a buried isolation line. The illustration in FIG. 8 includes the same matrix regions MAT and separating regions SEP as the illustration in FIG. 7 and illustrates these sections only in an xz plane offset with respect thereto. As illustrated in FIG. 8, the isolation lines are also separated into sections ILA. Each of the sections ILA reaches from one driver-occupied separating region SEP(a) as far as the next driver-occupied separating region SEP(a). A continuous passage of the isolation lines through the separating regions SEP(a) could pose integration-technological problems because the integration lines would then come into excessively close proximity to the segment drivers SDR situated in the separating regions SEP(a). Owing to this separation of the isolation lines into individual sections ILA, it is necessary to provide a dedicated connection for application of the required reverse-biasing potential for each of the sections.

Since there are no segment drivers present in the other separating regions SEP(b), where the word line segments WLS respectively end (cf. FIG. 7), the isolation line sections ILA can be drawn through there. At this location there is, moreover, enough freedom for a vertically upwardly directed isolation line contact ILC which connects the isolation line section ILA to an interconnect ILS carrying the reverse-biasing potential IPOT for the isolation lines, that is to say the potential for permanently turning off the isolation transistors.

Figure 9:
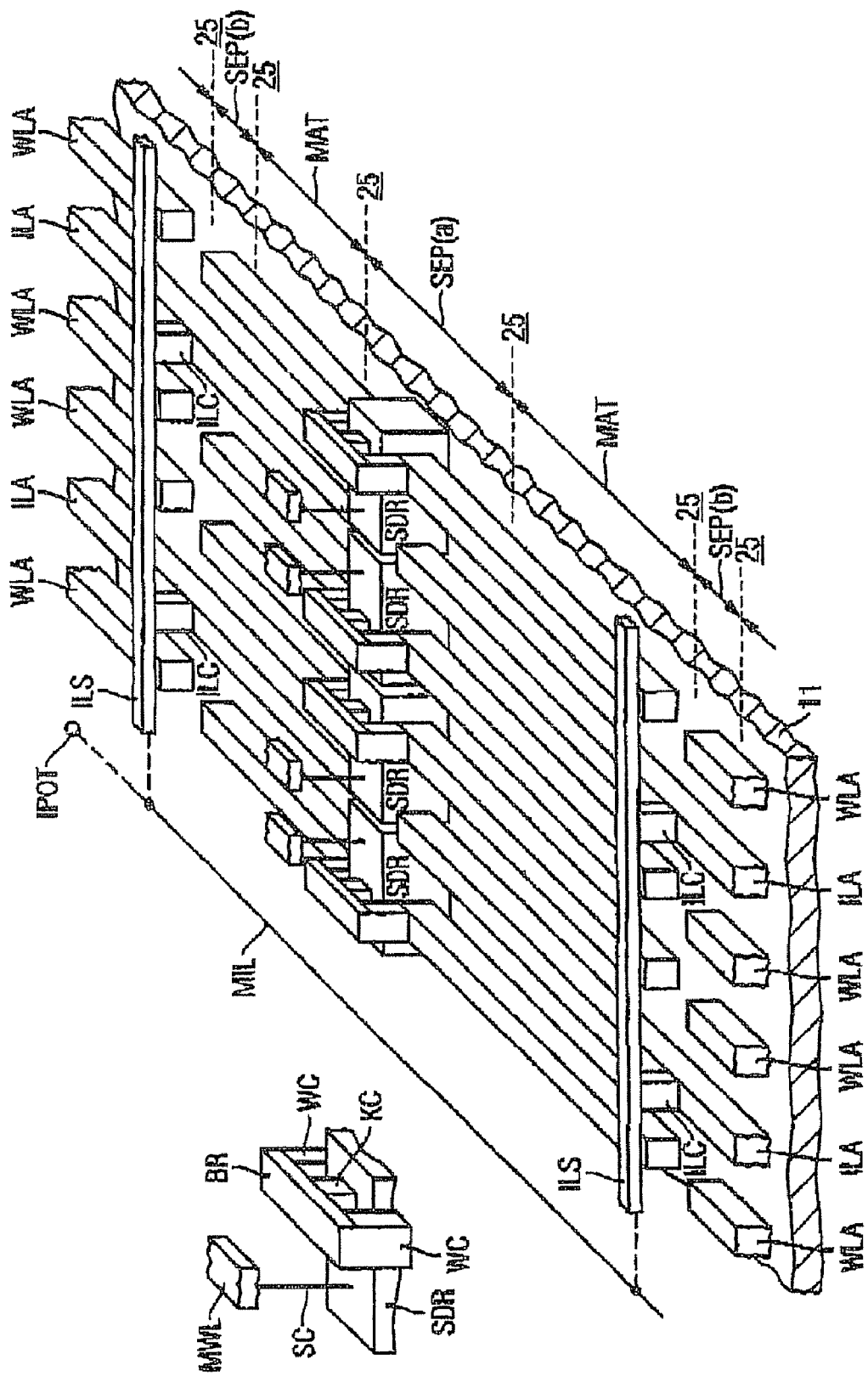
FIG. 9 illustrates the memory block according to FIGS. 7 and 8 in a fragmentary perspective illustration.

FIG. 9 illustrates parts of the memory block fragment whose sectional views are illustrated in FIG. 7 and FIG. 8, in a perspective view, the viewing direction being the same as in FIG. 4. For reasons of clarity, only the word lines and isolation lines are shown in the matrix regions MAT. These regions in reality correspond to the illustration in FIG. 4 and are, of course, significantly longer in the x direction in comparison with the separating regions SEP(a) and SEP(b). The segment driver contacts FC, AC, RC and the lines LPOT, WLACT, WLRES connected thereto (see FIG. 6) are not illustrated (but are, of course, nevertheless present).

FIG. 9 illustrates the word line sections WLA, the isolation line sections ILA, the segment drivers SDR, their word line contacts WC1, WC2, their output contacts KC, the bridge lines BR and the assigned master word lines MWL in their physical form, wherein the segment drivers SDR are shown in a simplified manner as blocks and the master word lines MWL are only illustrated in fragmentary fashion. The selection contacts SC connected to the master word lines MWL are only shown as thick black vertical lines. The activation contacts AC, the reset contacts RC and the foot contacts FC of the segment drivers are also indicated as thick black vertical lines.

In the case illustrated, the bridge lines WL run as interconnects in a metallization level M0 (see FIG. 7) lying between the level of the bit lines BL and the level of the cell layer 30. The interconnects ILS connected to the isolation line contacts ILC are likewise integrated in the M0 level (also see FIG. 8). The interconnects ILS run within the separating regions SEP (b) in the y direction, that is to say transversely with respect to the row direction, and are led out at one or both sides of the memory block, where they are connected to one another and to a master isolation line MIL, which runs outside the memory block and, for its part, is connected to the source of the reverse-biasing potential IPOT.

In the exemplary embodiment illustrated in FIGS. 7 to 9, driver-occupied separating regions SEP(a) alternate with driverless separating regions SEP(b). That is to say that in each separating region SEP(a), the segment drivers SDR for all the matrix rows lie directly alongside one another. One alternative to this consists in arranging the segment driver pairs for adjacent row pairs in alternate separating regions, such that the word line segments in each case lie offset with respect to one another in the x direction in pairs. Such an "interleaved word line segmentation" is illustrated in FIG. 10.

Figure 10:
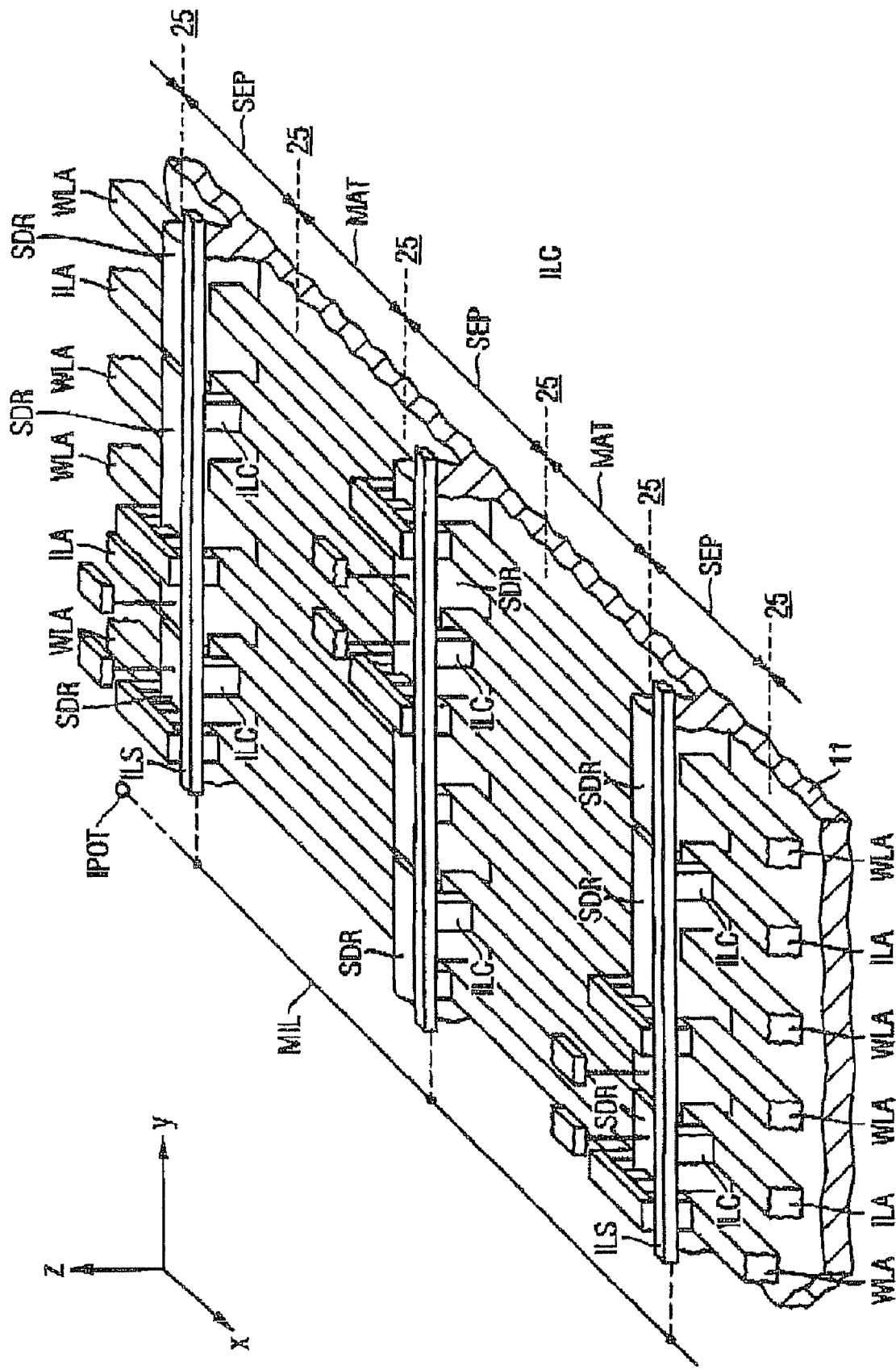
FIG. 10 and FIG. 11 illustrate, in a fragmentary perspective illustration, two other exemplary embodiments of a segmented memory block with segment drivers.

The embodiment according to FIG. 10 differs from the structure according to FIG. 9 by virtue of the fact that all the separating regions SEP are occupied by segment drivers SDR, wherein each separating region SEP contains a number of drivers that is only half as large as in a separating region SEP(a) according to FIG. 9. This permits the segment drivers SDR to be made significantly wider in the y direction than in the case of the non-interleaved word line segmentation according to FIG. 9. The selection contacts SC of the drivers SDR and the master word lines MWL connected thereto are shown in FIG. 10 in the same way as in FIG. 9.

In the embodiment according to FIG. 10, both the word line sections WLA and also the isolation line sections ILA in each case end at all the separating regions SEP. In the case illustrated, the ends of the isolation line sections ILA, at an end of each separating region SEP, are connected via a respective isolation line contact ILC to an interconnect ILS which is integrated in the M0 level and runs along the end edge of the separating region SEP in the y direction, that is to say transversely with respect to the row direction. In a manner similar to that in the case of FIG. 9, the interconnects ILS are led out at one or both sides of the memory block, where they are connected to one another and to a master isolation line MIL, which runs outside the memory block and, for its part, is connected to the source of the reverse-biasing potential IPOT. The x positions of the isolation line contacts ILC and of the interconnects ILS lie between the word line contacts WC and the adjacent edge 25 of the matrix region MAT.

In accordance with FIG. 10, the interconnects ILS for connecting the isolation line sections ILA are laid in each case only at one edge of each separating region SEP. This suffices to connect each isolation line section to the master isolation line MIL. Instead of this, such interconnects ILS can also be laid at both edges of every second separating region SEP or, if desired, also at both edges of each separating region SEP.

Figure 11:
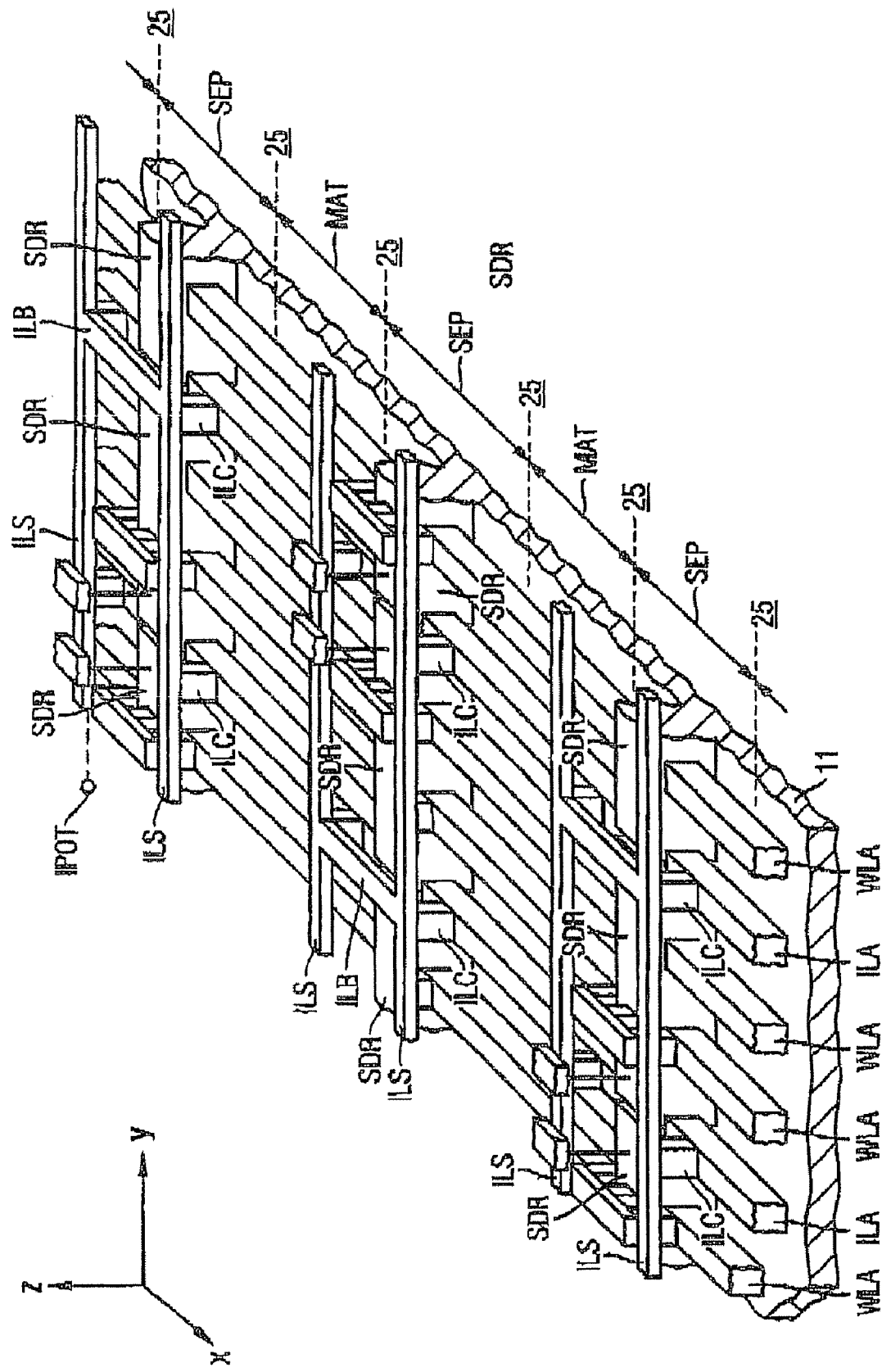

An arrangement in which the transversely running interconnects ILS are provided at both edges of each separating region is illustrated in FIG. 11. For reasons of clarity, this Figure does not show the contacts AC, RC and FC of the segment drivers SDR. The two interconnects ILS in each separating region SEP are connected to one another by bridges ILB, which are likewise integrated in the M0 level.

Consequently, it suffices for only one of all the interconnects ILS to be externally connected to the reverse-biasing potential IPOT, as illustrated in FIG. 11. In one embodiment, for this purpose that interconnect ILS is selected which is situated at an end of the memory block, such that the wiring to the source of the reverse-biasing potential IPOT does not require additional line paths along the length of the memory block.

Figure 12:
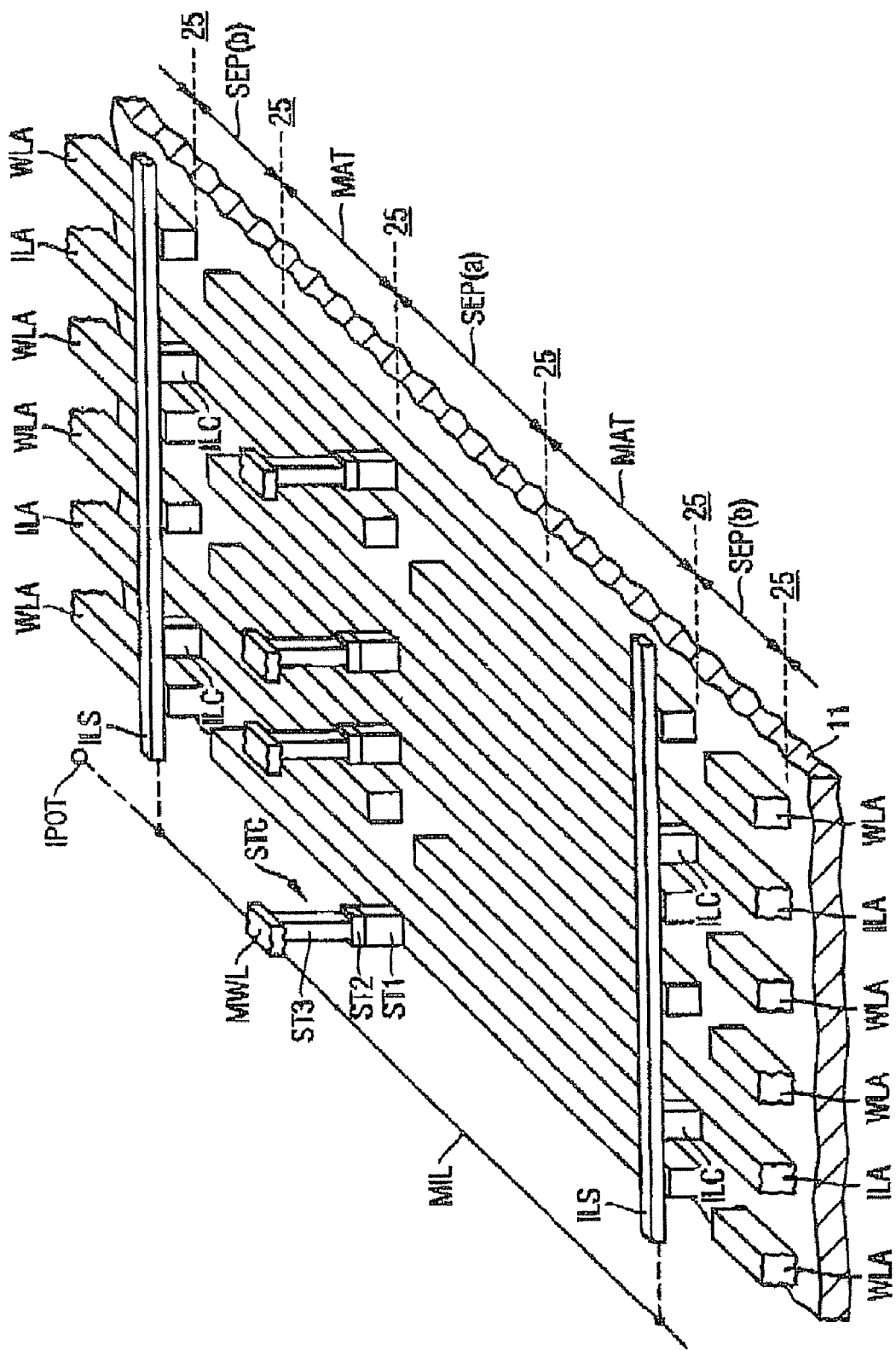
FIG. 12 to FIG. 14 illustrate, in fragmentary perspective illustrations, three different exemplary embodiments of a segmented memory block without segment drivers.
Figure 13:
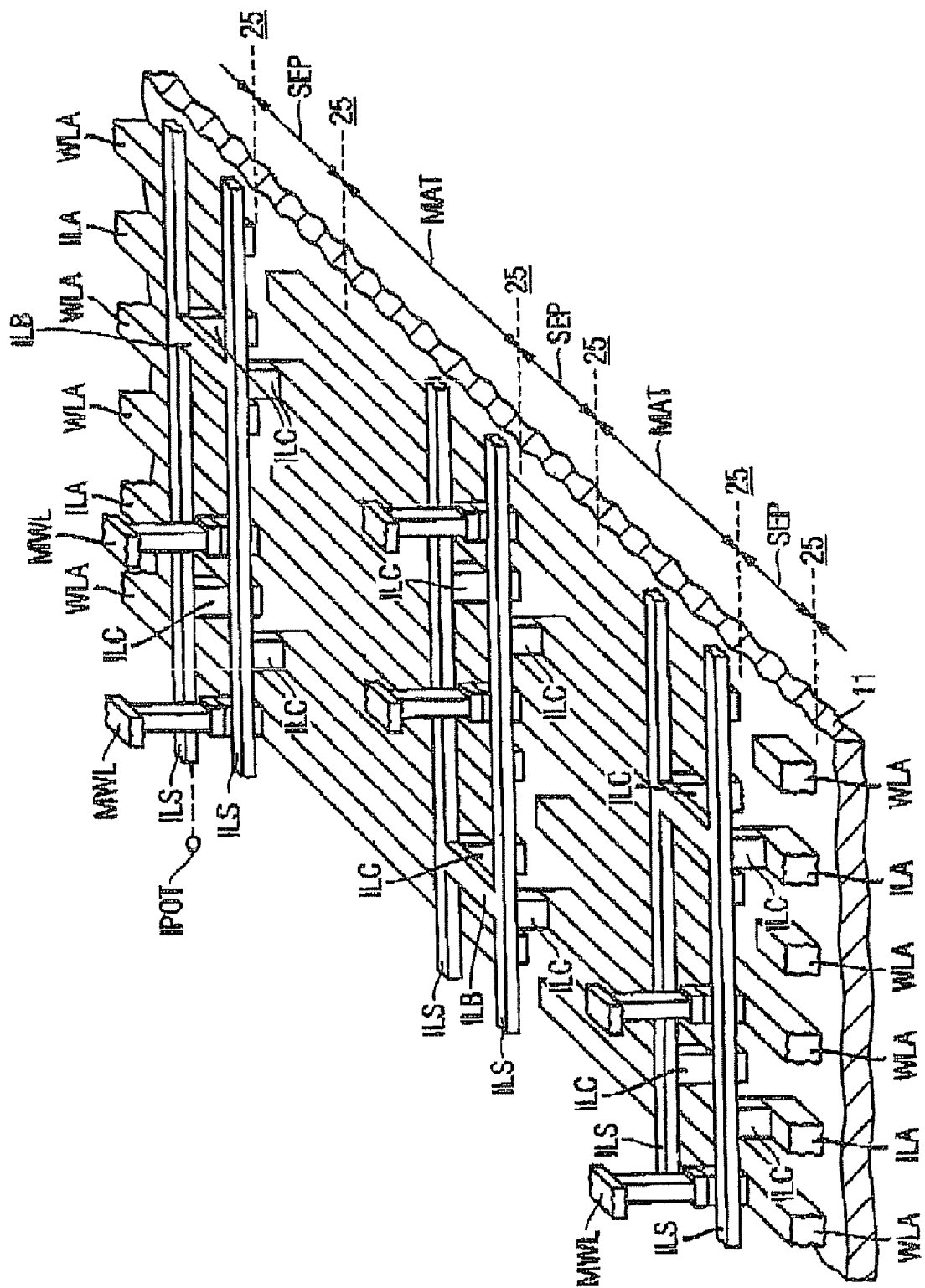
Figure 14:
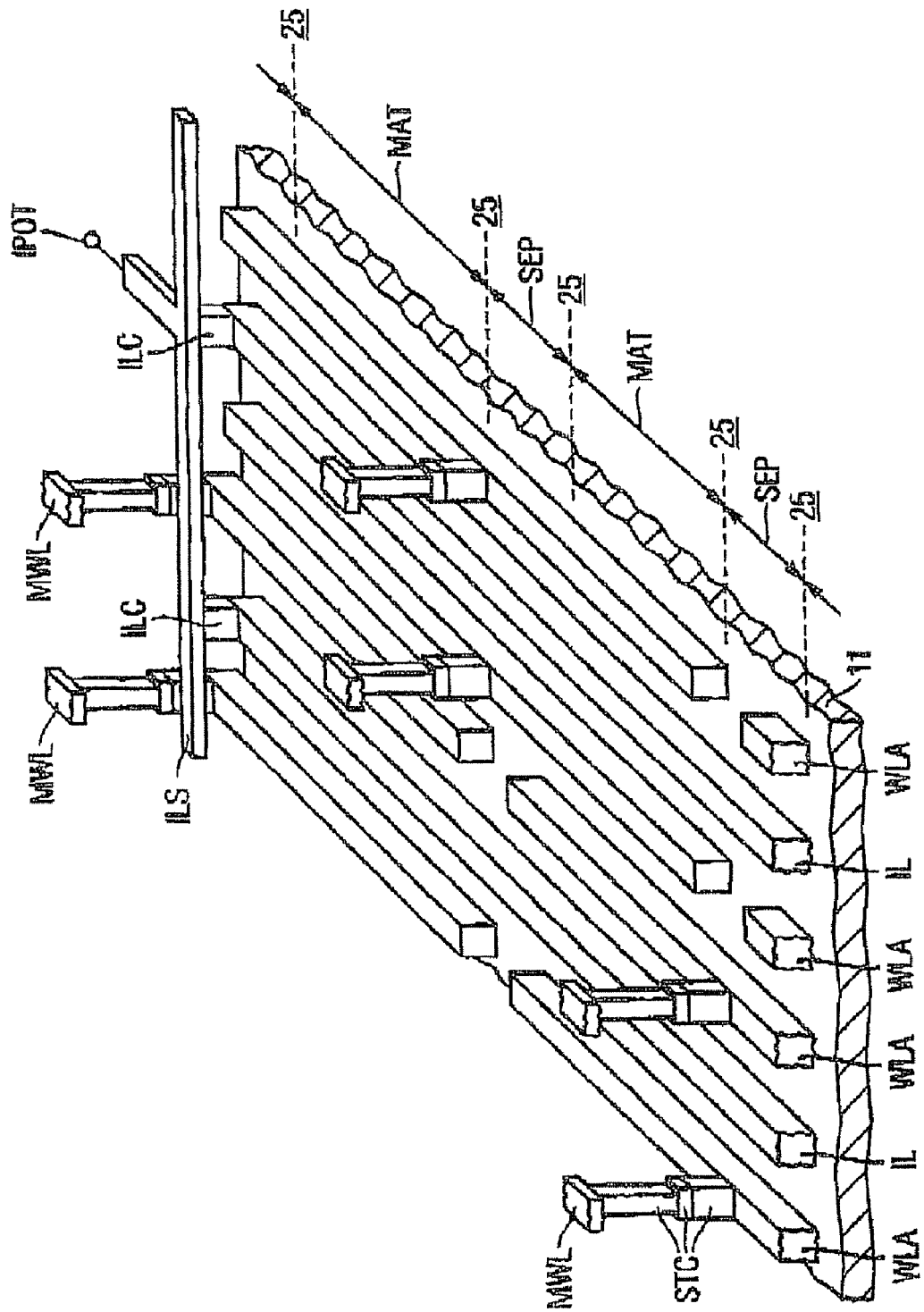

FIGS. 9 to 11 described above illustrate various connection scenarios for the isolation line sections ILA if the word line segments are in each case controlled by segment drivers SDR which, for their part, are connected to master word lines MWL. As an alternative, however, the word line segments can also be directly connected to the assigned master word lines, which in this case should have a particularly low nonreactive resistance (material having a very good conductivity and/or large cross-sectional area) in order to keep their RC time constant small. Instead of the segment drivers, simple contact paths in the form of "through stitches" composed of conductive material, similar to the backstitches in sewing, are provided between the word line segments and the master word lines. Therefore, this technique can clearly be designated by the expression "stitched word lines". FIGS. 12 to 14 illustrate, in similar perspective illustrations to FIGS. 9 to 11, various scenarios for the segmentation of buried stitched word lines WL in conjunction with buried isolation lines IL.

The structure according to FIG. 12 corresponds to the example illustrated in FIG. 8 and FIG. 9 with regard to the segmentation of the word lines WL and the isolation lines IL. That is to say that the segmentation of the word lines WL is "non-interleaved". All the word line segments WLS end in separating regions SEP(b), and all the isolation line sections ILA are drawn through via the regions and end in intervening separating regions SEP(a) alternating with the regions SEP(b). Unlike in the case of FIG. 9, the word line segments WLS in accordance with FIG. 12 are not subdivided into sections, but rather are drawn through via the separating regions SEP(a) and connected there (that is to say in the center of the segments WLS) via vertical contact paths STC ("stitched contacts") to the respectively assigned master word line MWL. In the example illustrated, the stitched contacts STC each include three parts: a basic contact ST1 connected to the word line segment WLS, an intermediate contact ST2 formed by a metallization in the M0 level, and an upper part ST3, which leads from the intermediate contact ST2 to the master word line, which can be formed by an interconnect in the M1 metallization level. The isolation line sections ILA are connected in the separating regions SEP(b) in the same way as in the exemplary embodiment according to FIGS. 7 to 9.

The structure according to FIG. 13 corresponds to the example illustrated in FIG. 11 with regard to the segmentation of the word lines WL and the isolation lines IL. That is to say that the segmentation of the word lines WL is "interleaved". Unlike in the case of FIG. 11, the word line segments WLS in accordance with FIG. 13 are not subdivided into sections, rather each segment WLS reaches continuously without interruption from one separating region SEP as far as the next but one separating region SEP and, within the intervening separating region, is connected via vertical stitched contacts to the respectively assigned master word line MWL. The isolation line sections ILA end at all the separating regions SEP and, at both ends of the regions, are connected to one another via vertical contacts ILC and transversely running interconnects ILS in the M0 level. The two interconnects ILS in each separating region SEP are connected to one another by bridges ILB, which are likewise integrated in the M0 level. Consequently, it suffices for only one of all the interconnects ILS to be externally connected to the reverse-biasing potential IPOT, as illustrated in FIG. 13. In one embodiment, for this purpose that interconnect ILS is selected which is situated at an end of the memory block, such that the wiring to the source of the reverse-biasing potential IPOT does not require additional line paths along the length of the memory block.

Since, in a memory block formed with stitched word lines, no segment drivers are present in the separating regions, the isolation line sections ILA can also be drawn through via a plurality of successive separating regions, thereby requiring fewer transversely running interconnects ILS as illustrated in FIGS. 12 and 13. For connecting the isolation line sections ILA among one another and to the reverse-biasing potential IPOT, it may then suffice to provide the isolation line contacts ILC and the transversely running interconnects ILS in each case only at an x position of the isolation line sections ILA drawn through. The position may be one of the separating regions where the isolation line sections ILA end, or any of the intervening separating regions.

Such a "through wiring" of the isolation line sections which passes over a relatively long length would pose problems in the case of word and isolation lines that are not buried, because in such cases appreciable coupling capacitances result between the lines among one another and between the lines and the bit lines. The coupling capacitances are significantly lower in the case of buried word line structures. Consequently, the proportion of the couplings relative to the total capacitance of the word line arrangement is so small that a high-performance interference suppression is not necessary. Since, on account of the buried structure, particularly in the case of one embodiment according to FIGS. 2 to 5, the isolation lines have de facto no bit line coupling whatsoever and the word line coupling is likewise negligible, no significant dynamic interference with the potential of the isolation lines occurs during operation. Moreover, conversely interference with the word and bit lines by the operation of the isolation lines is precluded because the potential of the isolation lines (reverse-biasing potential IPOT) is static.

Owing to these circumstances it is even possible, without any problems, to draw the isolation lines IL through without interruption over the entire memory block in the case of stitched word line segments, as is illustrated as an example in FIG. 14. This Figure illustrates a structure with interleaved word line segments whose division and connection to the master word lines correspond to the example according to FIG. 13. Unlike in the case of FIG. 13, the isolation lines IL are not subdivided into sections, but rather are drawn through without interruption over the length of the memory block and are connected only at an x position via vertical contacts ILC to a transversely running interconnect ILS, which, for its part, is connected to the reverse-biasing potential IPOT. The x position of the interconnect ILS can be any of the separating regions SEP in which stitched contacts STC are provided for the word line sections WLA. In a particular embodiment, the interconnect ILS is situated at an end of the memory block, as illustrated in FIG. 14, such that the wiring to the source of the reverse-biasing potential IPOT does not require additional line paths along the length of the memory block. If desired, such a transversely running interconnect can additionally also be provided at the other end of the memory block, likewise with a connection to the reverse-biasing potential IPOT (not illustrated).

Embodiments of the invention are not restricted to the embodiments described and illustrated pictorially, these embodiments merely being examples. Moreover, it should be mentioned that the drawings are not to scale.

Instead of the burying structure with "deeply drawn horizontal transistors" as illustrated in FIGS. 2 to 5, other burying structures can also be used, e.g., the abovementioned structure with vertical transistors. It is also possible to use an arrangement in which a respective isolation line is provided between all adjacent word lines, as described above with reference to FIG. 3.

If segment drivers are used, they can also be formed differently than was described above with reference to the circuit diagram according to FIG. 6. In any event, however, at least one connection of each driver will have to be connected via a vertical contact path to an interconnect of a bundle which runs in the row direction and must therefore lie in a different integration level than the transversely running interconnects for connecting the isolation lines.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
switching transistors;
isolation transistors arranged between the switching transistors;
control lines for applying control potentials to the switching transistors, the control lines being buried structures; and
isolation lines arranged between control lines for applying a potential to the isolation transistors to keep the isolation transistors turned off, the isolation lines being buried structures,
wherein the control lines are subdivided into sections, regions free of switching transistors are provided at intervals along the control lines, connections for feeding the control potentials into the sections of the control lines are provided at least in a subset of the regions free of switching transistors, and wherein the isolations lines are connected to one another by an interconnect running transversely with respect to the control lines.

2. The integrated circuit of claim 1, comprising wherein the isolations lines are connected to one another by the interconnect running transversely with respect to the control lines at an end portion of the control lines.

3. The integrated circuit of claim 1, comprising wherein the isolations lines are connected to one another by the interconnect running transversely with respect to the control lines within a region free of switching transistors.

4. The integrated circuit of claim 1, comprising:
memory cells arranged in matrix form in rows and columns and, for the purpose of writing and reading memory data, in each case by means of the turning on of an individually assigned switching transistor used as selection transistor, can be connected to a bit line individually assigned to the relevant matrix column and extends in the column direction; and
wherein the selection transistors in each case assigned to the same row can be controlled by a common word line, wherein these word lines are the control lines.

5. The integrated circuit of claim 4, comprising wherein the selection transistors are integrated on a common semiconductor substrate in groups in each case along separate strip-type active regions, wherein an isolation transistor is in each case integrated between adjacent selection transistors or between adjacent pairs of selection transistors;
wherein the selection transistors and isolation transistors are formed as field effect transistors and shaped in such a way that their drain and source zones representing the main electrodes in each case form elevated regions on both sides of a groove in which is arranged the gate insulated from the bottom and walls of the groove;
wherein the gates of all the selection transistors for the respective same matrix row are formed by a common word line extending in the row direction; and
wherein the gates of the respective adjacent isolation transistors are formed by a common isolation line, wherein the word lines and isolation lines extend in the row direction.

6. The integrated circuit of claim 5, comprising wherein there is provided for each column a common bit line integrated in a level above the selection transistors and extends in the column direction and contact-connected via conductive feedthroughs to the first main electrodes of the selection transistors associated with the relevant matrix row.

7. The integrated circuit of claim 6, comprising wherein the memory cells are integrated in a cell layer above the bit line level and each memory cell is contact-connected via a conductive feedthrough to the second main electrode of the assigned selection transistor.

8. The integrated circuit of claim 7, wherein the cell layer comprises at least two matrix regions which are spaced apart in the row direction in order to define a respective separating region between the regions;
wherein there are integrated within all or selected separating regions segment drivers, and also conductive elements for connecting the segment drivers to assigned word line sections and to assigned master word lines, which extend in a metallization level above the segment drivers in the row direction;
wherein the isolation lines include sections which in each case end in the separating regions occupied with segment drivers; and
wherein each isolation line section within at least one of the separating regions is connected via a vertical contact path to an interconnect which runs in the column direction in the relevant separating region and is integrated in a different level than the master word lines and is connected to a source of the reverse-biasing potential.

9. A circuit arrangement comprising:
at least at least one block with a bundle composed of a plurality of control lines for controlling assigned switching transistors, in a semiconductor structure of which the control lines are buried;
wherein isolation transistors are situated between switching transistors assigned to different control lines, additional lines of the bundle being buried in the semiconductor structure of the isolation transistors, the potential of the additional lines keeping the isolation transistors turned off;
wherein regions free of switching transistors are provided at intervals along the bundle, connections for feeding control potentials into sections of the control lines are provided at least in a subset of the regions, and the additional lines, at the end of the bundle and/or within at least one of the regions, are connected to one another by an interconnect running transversely with respect to the bundle.

10. The arrangement of claim 9, comprising wherein the block containing the bundle of control lines is a memory block;
wherein the block contains a multiplicity of memory cells which are arranged in matrix form in rows and columns and, for the purpose of writing and reading memory data, in each case by using the turning on of an individually assigned selection transistor, can be connected to a bit line which is individually assigned to the relevant matrix column and extends in the column direction; and wherein the selection transistors which are in each case assigned to the same row can be controlled by a common word line, wherein these word lines are the bundle of control lines.

11. The arrangement of claim 10, comprising:

wherein the selection transistors are integrated on a common semiconductor substrate in groups in each case along separate strip-type active regions;

wherein an isolation transistor is in each case integrated between adjacent selection transistors or between adjacent pairs of selection transistors;

wherein the selection and isolation transistors are formed as field effect transistors and shaped in such a way that their drain and source zones representing the main electrodes in each case form elevated regions on both sides of a groove in which is arranged the gate insulated from the bottom and walls of the groove;

wherein the gates of all the selection transistors for the respective same matrix row are formed by a common word line extending in the row direction; and wherein the gates of the respective adjacent isolation transistors are formed by a common isolation line, wherein the word lines and isolation lines extend in the row direction.

12. The arrangement of claim 11, comprising wherein there is provided for each column a common bit line integrated in a level above the selection transistors and extends in the column direction and contact-connected via conductive feedthroughs to the first main electrodes of the selection transistors associated with the relevant matrix row.

13. The arrangement of claim 12, comprising wherein the memory cells are integrated in a cell layer above the bit line level and each memory cell is contact-connected via a conductive feedthrough to the second main electrode of the assigned selection transistor.

14. The arrangement of claim 13, wherein the cell layer comprises:

at least two matrix regions which are spaced apart in the row direction in order to define a respective separating region between the regions;

and wherein there are integrated within all or selected separating regions segment drivers, and also conductive elements for connecting the segment drivers to assigned word line sections and to assigned master word lines, which extend in a metallization level above the segment drivers in the row direction;

wherein the isolation lines include sections which in each case end in the separating regions occupied with segment drivers; and wherein each isolation line section within at least one of the separating regions is connected via a vertical contact path to an interconnect which runs in the column direction in the relevant separating region and is integrated in a different level than the master word lines and is connected to a source of the reverse-biasing potential.

15. The arrangement as claimed in claim 14, comprising:

wherein the word lines are divided into sections which end in each separating region; and wherein the segment drivers are only arranged in separating regions of a first type, at which the isolation line sections also end and which alternate with separating regions of a second type, in which the isolation line sections are contact-connected to an interconnect running in the column direction.

16. The arrangement of claim 14, comprising:

wherein each separating region contains segment drivers;

wherein both the word lines and the isolation lines are in each case divided into sections which end in all the separating regions; and wherein the isolation line sections in each separating region, at least at one end of the region, are contact-connected to an interconnect running in the column direction.

17. The arrangement of claim 16, comprising:

wherein the isolation line sections, at both ends of each separating region, are contact-connected to an interconnect running in the column direction; and wherein, in each separating region, the two interconnects running in the column direction are connected to one another via at least one interconnect running in the row direction.

18. The arrangement of claim 13, wherein the cell layer comprises at least two matrix regions which are spaced apart in the row direction in order to define a respective separating region between the regions;

wherein there are provided within all or selected separating regions vertical contact paths which connect segments of the word lines to master word lines, which extend in a metallization level above the word line sections in the row direction; and wherein the isolation lines, beyond the end of at least one of the matrix regions, are connected to one another via an interconnect which extends in the column direction and is connected to a source of the reverse-biasing potential.

19. The arrangement of claim 18, comprising:

wherein the word line sections are contact-connected to the master word lines in separating regions of a first type and end in separating regions of a second type, which alternate with the separating regions; and wherein the isolation line sections, in each separating region of a second type, are connected to an interconnect extending in the column direction.

20. The arrangement of claim 18, comprising:

wherein all the separating regions contain contacts between word line sections and master word lines; and wherein the isolation line sections in each separating region, at least at one end of the region, are contact-connected to an interconnect running in the column direction.

21. The arrangement of claim 20, comprising:

wherein the isolation line sections, at both ends of each separating region, are contact-connected to an interconnect running in the column direction; and wherein, in each separating region, the two interconnects running in the column direction are connected to one another via at least one interconnect running in the row direction.

22. The arrangement of claim 18, comprising wherein the isolation line sections run continuously over a plurality of successive separating regions and are connected to one another via an interconnect only in one of the separating regions, where they end, or in one of the intervening separating regions, the interconnect extending in the column direction and being connected to a source of the reverse-biasing potential.

23. The arrangement of claim 18, comprising wherein the isolation lines run continuously over the entire length of the memory block and are connected to one another via an interconnect only in one of the separating regions or at least one end of the memory block, the interconnect extending in the column direction and being connected to a source of the reverse-biasing potential.

24. An integrated circuit comprising:
switching transistors;
isolation transistors;
control lines comprising buried structures; and
isolation lines,
wherein the control lines are subdivided in sections, regions, regions free of switching transistors are provided along the control lines, connections configured to feed control potentials to the switching transistors in some of the regions free of switching transistors, and
wherein the isolation lines are connected to one another by an interconnect running traversely to the control lines.

25. An integrated circuit comprising:
means for switching;
isolation transistors arranged between the switching means;
control lines for applying control potentials to the switching means, the control lines being buried structures; and
isolation lines arranged between control lines for applying a potential to the isolation transistors to keep the isolation transistors turned off, the isolation lines being buried structures,
wherein the control lines are subdivided into sections, regions free of switching transistors are provided at intervals along the control lines, connections for feeding the control potentials into the sections of the control lines are provided at least in a subset of the regions free of switching transistors, and wherein the isolations lines are connected to one another by an interconnect running transversely with respect to the control lines.

* * * * *